(12) United States Patent
Shimizu et al.

(10) Patent No.: US 6,462,373 B2
(45) Date of Patent: Oct. 8, 2002

(54) NONVOLATILE SEMICONDUCTOR MEMORY DEVICE HAVING TAPERED PORTION ON SIDE WALL OF CHARGE ACCUMULATION LAYER

(75) Inventors: Kazuhiro Shimizu, Yokohama (JP); Riichiro Shirota, Fujisawa (JP); Naoki Koido, Yokohama (JP); Seiichi Aritome, Yokohama (JP); Hiroaki Tsunoda, Yokkaichi (JP); Tadashi Iguchi, Yokkaichi (JP); Kazuhito Narita, Yokkaichi (JP); Kunihiro Terasaka, Yokkaichi (JP); Hirohisa Iizuka, Centreville, VA (US)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/725,564

(22) Filed: Nov. 30, 2000

(65) Prior Publication Data

US 2001/0019508 A1 Sep. 6, 2001

(30) Foreign Application Priority Data

Dec. 1, 1999 (JP) .......................................... 11-342358

(51) Int. Cl.[7] ............................................ H01L 29/788
(52) U.S. Cl. ..................... 257/315; 257/314; 438/201; 438/211
(58) Field of Search ................................. 257/314, 315, 257/316, 317, 318, 319, 320, 321, 322, 323; 438/201, 211

(56) References Cited

U.S. PATENT DOCUMENTS 6,108,242 A * 8/2000 Lin et al.
6,165,845 A * 12/2000 Hsieh et al.
6,204,122 B1 * 3/2001 Joo et al.

FOREIGN PATENT DOCUMENTS

JP 8-017948 1/1996

* cited by examiner

Primary Examiner—Nathan J. Flynn
Assistant Examiner—Kevin Quinto
(74) Attorney, Agent, or Firm—Oblon, Spivak, McClelland, Maier & Neustadt, P.C.

(57) ABSTRACT

In a nonvolatile semiconductor memory device, a charge accumulation layer is formed between adjacent two device isolation regions, at least a portion of the charge accumulation layer sandwiched with the device isolation regions has side walls each having a taper angle of 80 degrees or more and less than 90 degrees so that the charge accumulation layer at a lower end has a width wider than that at an upper end, a size of an opening of each of the device isolation regions is 0.25 μm or less, and a gate length of a memory cell is 0.2 μm or less.

13 Claims, 13 Drawing Sheets

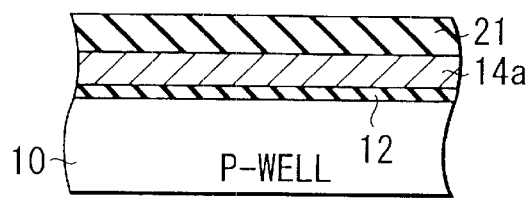
FIG. 2B1
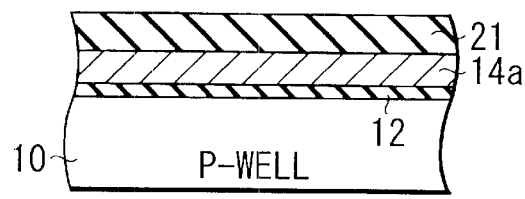
FIG. 2C1
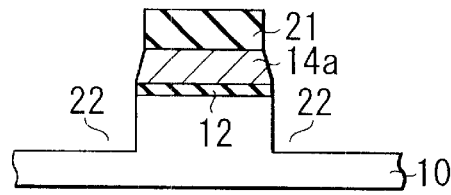
FIG. 2B2
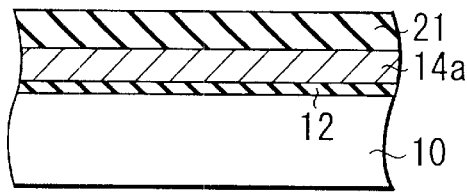
FIG. 2C2
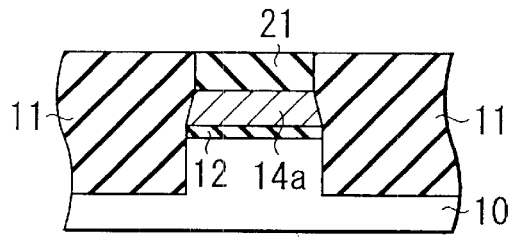
FIG. 2B3
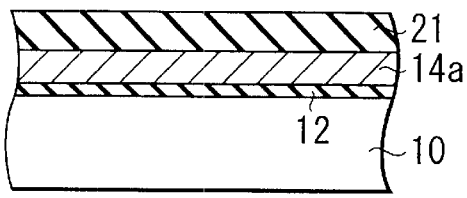
FIG. 2C3
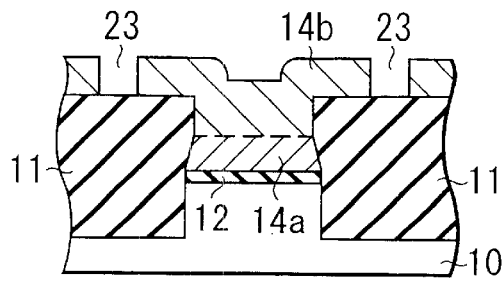
FIG. 2B4
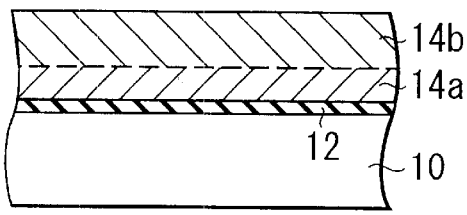
FIG. 2C4
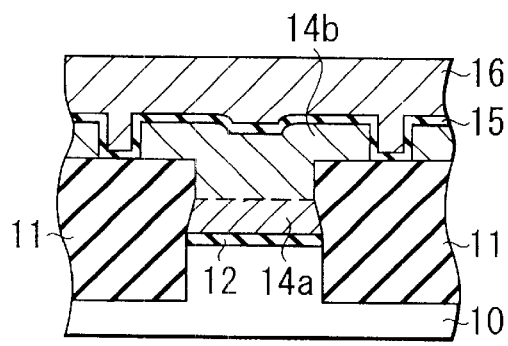
FIG. 2B5
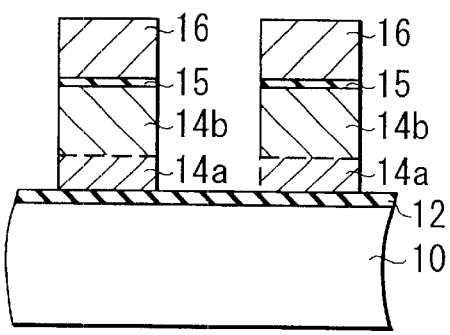
FIG. 2C5

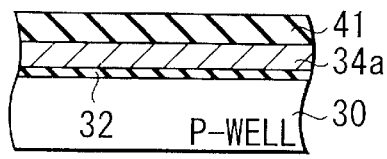
FIG. 7B1
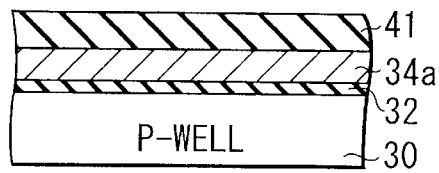
FIG. 7C1
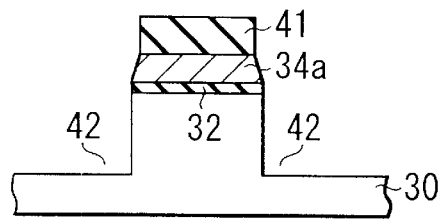
FIG. 7B2
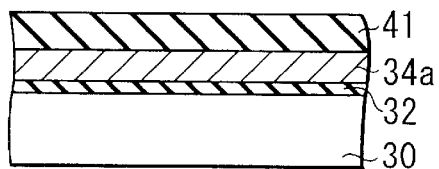
FIG. 7C2
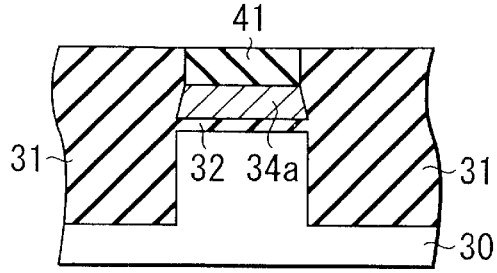
FIG. 7B3
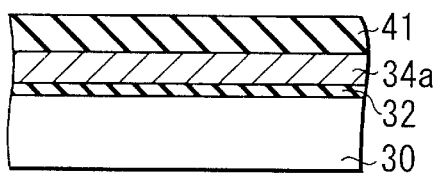
FIG. 7C3
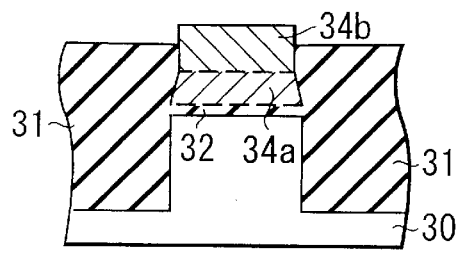
FIG. 7B4
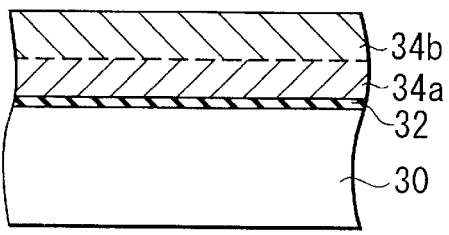
FIG. 7C4
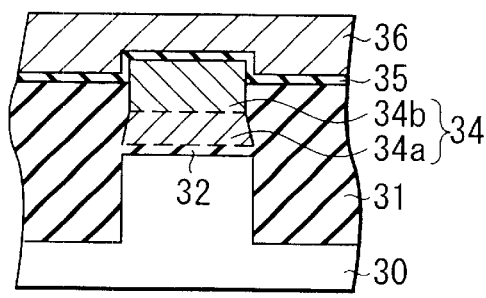
FIG. 7B5
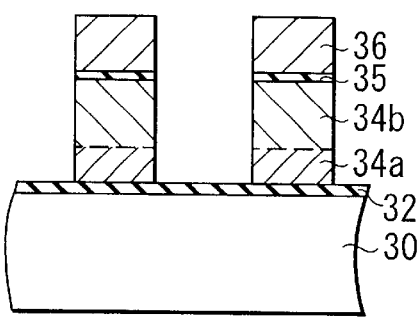
FIG. 7C5

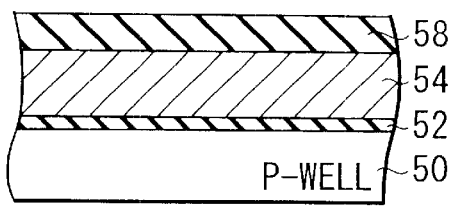
FIG. 9B1
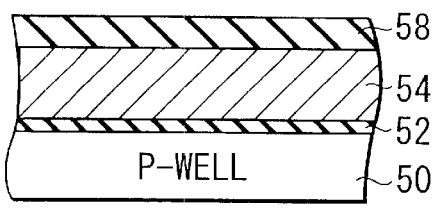
FIG. 9C1
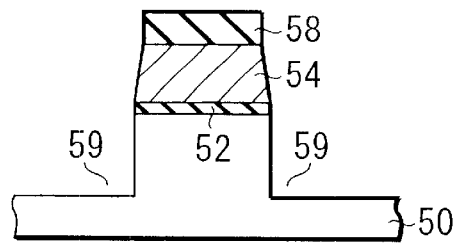
FIG. 9B2
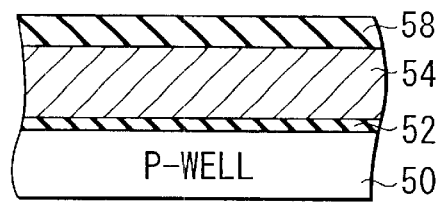
FIG. 9C2
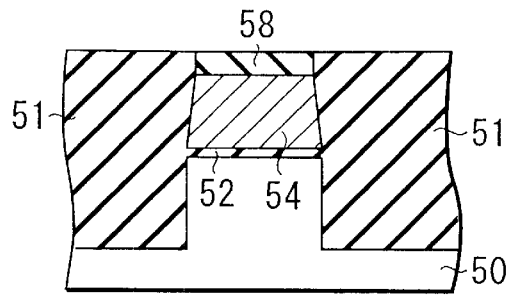
FIG. 9B3
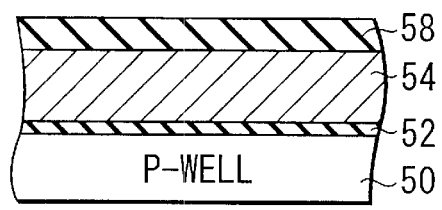
FIG. 9C3
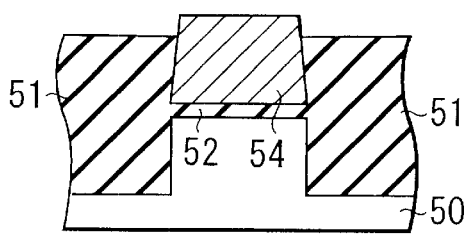
FIG. 9B4
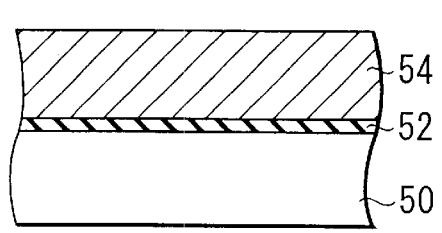
FIG. 9C4
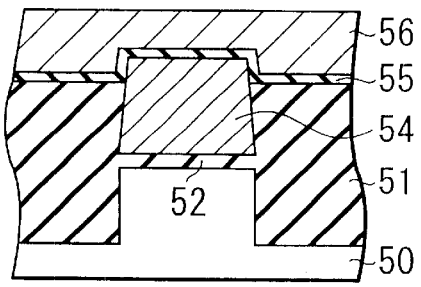
FIG. 9B5
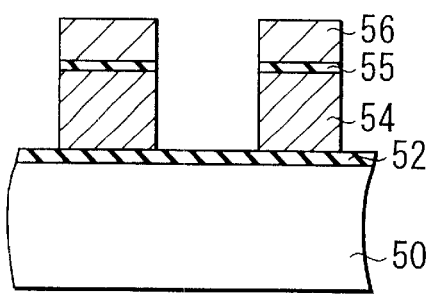
FIG. 9C5

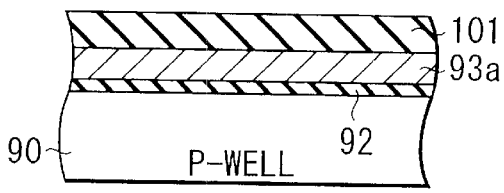
FIG. 14B1
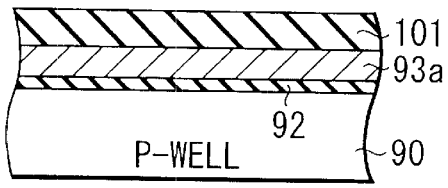
FIG. 14C1
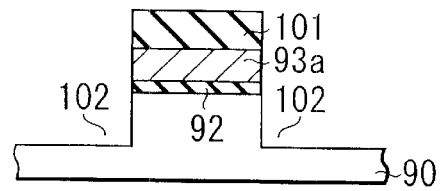
FIG. 14B2
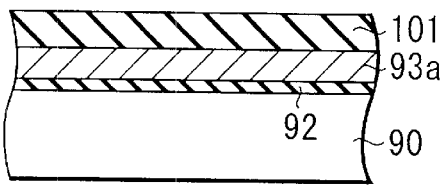
FIG. 14C2
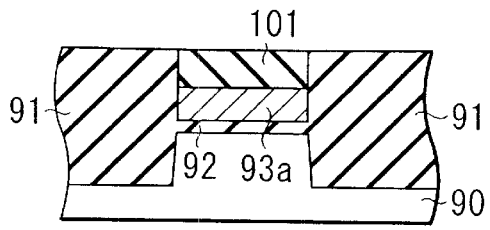
FIG. 14B3
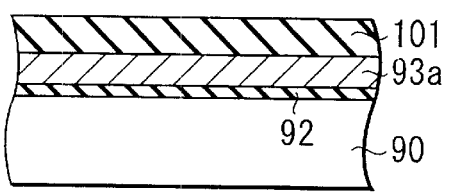
FIG. 14C3
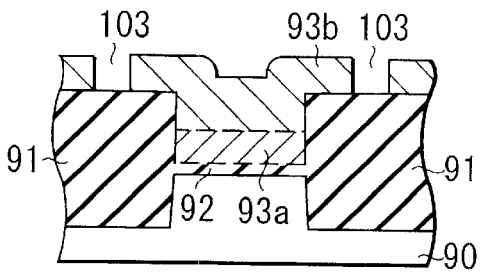
FIG. 14B4
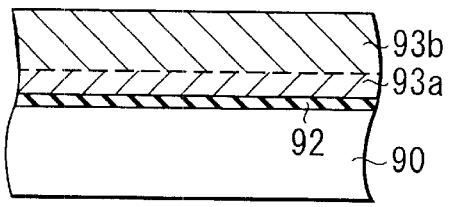
FIG. 14C4
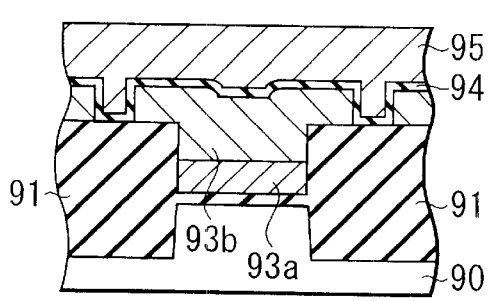
FIG. 14B5
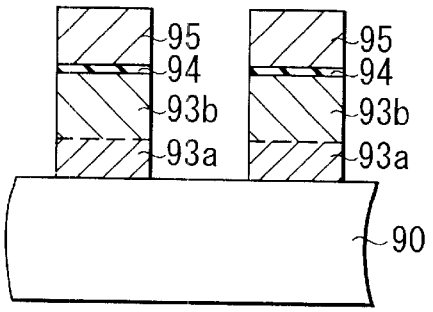
FIG. 14C5

NONVOLATILE SEMICONDUCTOR MEMORY DEVICE HAVING TAPERED PORTION ON SIDE WALL OF CHARGE ACCUMULATION LAYER

CROSS-REFERENCE TO RELATED APPLICATION

This application is based upon and claims the benefit of priority from the prior Japanese Patent Application No. 11-342358, filed Dec. 1, 1999, the entire contents of which are incorporated herein by reference.

BACKGROUND OF THE INVENTION

The present invention relates to nonvolatile semiconductor memory devices, and more particularly to a high density and high integration type nonvolatile semiconductor memory device having an improved memory cell structure.

Electrically data rewritable nonvolatile memory devices are widely used in high-speed ROMs and for mass storage devices. MOSFET type memory devices are generally used each of which has a stack gate structure comprising a charge accumulation layer or a floating gate and a control gate.

FIGS. 11A through 11C are views showing an example of a memory cell having the stack gate structure. FIG. 11A is a plan view thereof, FIG. 11B is a sectional view taken along the line b—b of FIG. 11A, and FIG. 11C is a sectional view taken along the line c—c of FIG. 11A.

In FIGS. 11A through 11C, for example, a trench for a device isolation is formed in a p-well layer 70 formed on an n-type silicon substrate. Inside of this trench, an insulation material for the device isolation, for example, a silicon dioxide is buried to form a plurality of device isolation regions 71, thereby defining device forming regions 76 between the device isolation regions 71.

On an overall surface of a channel region or the device forming region 76 which is device-isolated in such a manner, a thin tunnel insulation film 72 is formed which allows a tunnel current to flow. On the thin tunnel insulation film 72, a charge accumulation layer 73 is formed. Then, on the charge accumulation layer 73, a control gate 75 is further formed via an insulation film 74 which functions as an inter-gate insulation layer. The control gate 75 and the charge accumulation layer 73 are vertically processed in a self-aligning manner so that the side end portions are aligned as shown in FIG. 11C on a cross section in a direction of so-called word lines, namely, a direction in which the control gate 75 is extended. Furthermore, an n-type diffusion layer 77 is formed in a self-aligning manner in the device forming region 76 on both sides of each gate with respect to this side end portion. This n-type diffusion layer 77 is extended and formed between adjacent control gates 75. In this manner, a nonvolatile memory cell is formed on each part of the gate portion.

On the other hand, on the cross section of FIG. 11B in the so-called bit line direction for supplying a potential to the diffusion layer 77 of the memory cell, the charge accumulation layer 73 is cut with the insulation film 74 on the device isolation region 71 so that the charge accumulation layer 73 is divided for each of the memory cells. Then the divided charge accumulation layer 73 is capacity-coupled with the control gate 75 via the insulation film 74 between gates 73 and 75.

A data rewriting method in the nonvolatile memory cell having the above structure comprises the steps of applying a high voltage across the p-well layer 70 and the charge accumulation layer 73 to allow a tunnel current to flow through the tunnel insulation film 72 thereby exchanging the electric charge between the charge accumulation layer 73 and the p-well layer 70, thereby modulating a quantity of the electric charge in the charge accumulation layer 73 in accordance with data being written.

A channel generation threshold voltage of a memory cell becomes higher with an increase in a negative electric charge in the charge accumulation layer 73 while the threshold voltage thereof becomes lower with an increase in a positive electric charge. Consequently, when electrons are tunnel-injected into the charge accumulation layer 73, the threshold voltage is heightened with the result that the charge accumulation layer 73 is set to, for example, a datawritten state. When electrons are pulled out from the charge accumulation layer 73, the threshold voltage becomes lower so that the charge accumulation layer 73 is set to, for example, an erased state.

FIG. 12 is a view showing one example of a nonvolatile semiconductor memory device using the memory cells. In FIG. 12, there is shown a case in which the memory cells are laid out in a NAND structure. A plurality of device forming regions 76 which are isolated in a plurality of device isolation regions 71 are extended and arranged in a direction of bit lines with the result that that a plurality of control gates 75-1 to 75-n are extended and arranged in a direction which runs at right angle with the device forming region 76. A plurality of memory cells are formed in a matrix-like configuration at each of the crossing points of the control gates 75-1 to 75-n and the device forming region 71, and n-type diffusion layers 77 are formed in the device forming region 76 between the respective control gates 75-1 to 75-n.

As a consequence, a plurality of memory cells are connected in series in a direction of bit lines via the n-type diffusion layers 77 to constitute a unit block. Each of the unit blocks is connected to the bit line contact 81 via the selection gate 80 formed of a transistor. Outside of the selection gates 82 on the opposite side of the bit line contacts 81 in the unit blocks a common source line 83 is arranged and is connected via the n-type diffusion layer 77. Incidentally, the bit line contacts 81 are connected to bit line signal lines not shown.

Along with an increase in the memory capacity of the nonvolatile semiconductor memory device, an increase in the density of the memory cell is extremely important, and a shrinkage in the memory size through the refinement of the memory cell is effective means for the realization of the increase in the density of the memory device. For this purpose, it is most important to suppress the disparity in the size of each of the memory devices in addition to the refinement of the stack gate and the device forming region or the like.

With respect to the stack gate structure, as explained in FIG. 11C, it is effective to align the side walls or side end portion in a self-aligning manner by processing collectively the second gate insulation film 74 and the charge accumulation layer 73 at the time of processing the control gate 75.

On the other hand, with respect to the width of the device forming region or the width of the device isolation region, it is important to set the width of the charge accumulation layer 73 and the width of the device forming region to an equal size. There is proposed a self-aligning method for forming a charge accumulation layer in advance followed by forming in a self-aligning manner a device forming region in alignment with the charge accumulation layer (Japanese Patent Application No. 6-150241).

FIGS. 13A through 13C are views showing one example of a memory cell having a self-aligning type device isolation structure. FIG. 13A is a plan view, FIG. 13B is a sectional view taken along the line b—b of FIG. 13A, and FIG. 13C is a sectional view taken along the line c—c of FIG. 13A in the same manner.

For example, as shown in FIG. 13B, a trench for the device isolation is formed inside of the p-well layer 90. Inside of the trench, an insulation material for the device isolation, for example, silicon dioxide is buried, so that a device isolation region 91 is formed. On the overall surface of the channel region on the p-well layer 90 which is device-isolated, a thin tunnel insulation film 92 is formed which allows a tunnel current to flow.

On the tunnel insulation film 92, as shown in FIGS. 13A and 13C, a conductive layer 93a which forms a part of the charge accumulation layer 93 and which has a side end portion aligned with the device forming region 96 is formed. On the conductive layer 93a, another conductive layer 93b is formed, so that the conductive layer 93a and the conductive layer 93b are electrically set to the same potential and a laminated layer type charge accumulation layer 93 is formed. On the laminated type charge accumulation layer 93, a control gate 95 is formed via an insulation film 94 functioning as an inter-gate insulation film.

The control gate 95 and the laminated type charge accumulation layer 93 are vertically processed in a self-aligning manner so that the side end portions are aligned as shown in FIG. 13C in a so-called word line direction cross section on which the control gate 95 is extended with the result that the n-type diffusion layer 97 is formed between the gates.

On the other hand, on the so-called bit line direction cross section on which a potential is supplied to the diffusion layer 97 of the memory cell, as shown in FIG. 13B, the conductive layer 93b is cut with the insulation film 94 between the gates on the device isolation region 91 and the conductive layer 93b is cut for each of the memory cells with the result that the charge accumulation layer 93 is electrically separated for each of the memory cells. The charge accumulation layer 93 is capacity-coupled with the control gate 95 via the insulation film 94 between the gates.

FIGS. 14B1 through 14B5, and 14C1 through 14C5 are explanatory views showing a procedure of steps for manufacturing a memory cell having a structure shown in FIGS. 13A through 13C. FIGS. (14B1 through 14B5) on the left row of the drawings are sectional views taken along the line b—b of FIG. 13A while figures (14C1 through 14C5) on the right row are sectional views taken along the line c—c of FIG. 13A.

As shown in FIGS. 14B1 and 14C, a first conductive layer 93a is formed via the first gate insulation film 92 which forms a tunnel oxide film on, for example, the p-well 90, thereby forming a mask material 101 which forms a processed mask of the conductive layer 93a.

Next, as shown in FIGS. 14B2 and 14C2, the mask material 101 and the conductive layer 93a are patterned by using the lithography technique so that the mask material 101 and the conductive layer 93a are retained on the device forming region 96 thereby removing the mask material 101 and the conductive layer on the region where the device isolation region 91 is to be formed. Consequently, the first gate insulation film 92 and p-well 90 are removed by dry etching by using the retained mask material 101 thereby forming a trench 102.

At this time, the trench 102 and the side walls of the first conductive layer 93a are aligned. Furthermore, the depth of the trench 102 can be selected in accordance with the desired device isolation endurance pressure.

Next, after cleaning or an appropriate surface treatment is conducted, as shown in FIGS. 14B3 and 13C3, the insulation film 91 for the device isolation is buried in the trench 102, so that the buried film 91 is planarized and the thickness of the film is adjusted by polishing or etch-back. Thus, the device isolation region 91 is completed.

Next, as shown in FIGS. 14B4 and 14C4, after the mask material 101 is removed, a second conductive film 93b is directly formed on the conductive layer 83b. As shown in FIG. 14B4, the conductive layer 93b is cut with the slit 103 on the device isolation region 91, so that the charge accumulation layer 93 is isolated for each of the memory cells.

Lastly, as shown in FIGS. 14B5 and 14C5, after the second gate insulation film 94 and a conductive layer which forms the control gate 95 are formed, the control gate 95, the second gate insulation film 94, and the charge accumulation layer 93 are processed collectively in a direction of intersecting the device forming region 96 by dry etching. Consequently, as shown in FIG. 14C5, the side end portions of the members 93, 94 and 95 are aligned.

In the case where such a self-aligning type device isolation structure is formed, there is a problem in that the characteristic of the buried structure becomes wrong because the aspect ratio which is a ratio of the thickness and the width of the insulation film 91 at the time of burying the insulation film 91 for the device isolation in the trench 102 becomes large by the increase of the thickness of the first conductive layer 93a. Specifically, voids are generated inside of the buried device isolation insulation film 91 so that the voids are exposed on the surface at the time of the later planarization and the planarity is lost.

Furthermore, there is a problem that the residual of the gate material is generated at the time of processing the gate, so that a short-circuiting occurs between the charge accumulation layers 93 between the adjacent memory cells.

Such problem becomes more serious with an increase in the aspect ratio as described above. In the case where the width of the device isolation is narrowed along with the refinement of the device, the pitch of the bit line is narrowed and the width of the device forming region is narrowed in an effective manner, and in the case where the trench is deep, the problem becomes more conspicuous.

For example, when the width of the device isolation is 0.25 μm or less, and the depth of the trench is 0.25 μm or more, the problem is especially serious.

On the other hand, the residual of the conductive layer 93 between adjacent gates 95 must be completely removed at the time of processing the gate in FIGS. 14B5 and 14C5. However, when the pitch of the word line is narrowed along with the refinement, the gate width and the gate interval are narrowed so that the etching rate of the dry etching is lowered. In the case where the gate width and the gate interval have a wide and narrow portions in a mixed manner, the material for the charge accumulation layer 93 of an array portion such as a memory cell or the like are not removed and retained as residuals when etching is conducted in alignment with the wide region, so that a short-circuiting failure occurs between adjacent memory cells. The above problem becomes particularly conspicuous when the memory cells are formed with the gate width and the gate interval of 0.2 μm or less.

As described above, in the case where the self-alignment device isolation method is used in an attempt to increase the capacity and the density of the nonvolatile semiconductor memory device, the possibility becomes large that a problem arises such that the burring performance of the insulation film for the device isolation into the trench is abruptly deteriorated and the removal characteristic of the charge accumulation layer on the side end of the device isolation region is also abruptly deteriorated when the refinement size of the cell exceeds a certain value.

The above problem is likely to arise in all the nonvolatile semiconductor memory devices having a device isolation structure formed with the self-aligning method in the cell array structure other than the NOR type, the AND type, and NAND type including the DINOR type.

As has been described above, in the case where the self-alignment type isolation method is used in an attempt to increase the capacity and the density of the nonvolatile semiconductor memory device, there is a possibility that a problem arises such that the burying performance of the insulation film for the device isolation into the trench is abruptly deteriorated and the removal characteristic of the charge accumulation layer on the side end of the device isolation region is also abruptly deteriorated along with the refinement of the memory cells.

The present invention has been made in view of the above circumstances, and an object of the present invention is to provide, by solving the above problem, a large capacity, high density and low cost nonvolatile semiconductor memory device which can be constituted so that no residual is generated on both side end of the device isolation region at the time of gate processing while improving the buried characteristic of the device isolation region by forming the conductive layer which is a part of the charge accumulation layer with a tapered angle of 80 degrees or more and less than 90 degrees.

BRIEF SUMMARY OF THE INVENTION

In order to solve the above problem, the present invention provides a nonvolatile semiconductor memory device in which a plurality of memory cells are arranged in an array-like configuration to constitute a cell array having a plurality of device isolation regions buried by an insulation material in trenches formed in a semiconductor substrate, and a plurality of device forming regions each of which is divided with the device isolation regions, and in which each of the memory cells includes a charge accumulation layer formed via a first gate insulation film on the device forming region, and a control gate formed on the charge accumulation layer via a second gate insulation film, wherein at least a portion of the charge accumulation layer sandwiched with the device isolation regions has a lower end with a width larger than that of an upper end of the sandwiched portion, and the device isolation regions each has a width of 0.25 μm or less.

The charge accumulation layer is such that the buried configuration of the device isolation region is improved by narrowing the width of the upper end of the charge accumulation layer than the width of the lower end thereof at least at the portion sandwiched with the device isolation regions thereby enabling to set the width of the device isolation to be 0.25 μm or less.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A through 1C are views showing a portion of a nonvolatile semiconductor memory device according to a first embodiment in which FIG. 1A is a plan view thereof, FIG. 1B is a sectional view taken along the line b—b of FIG. 1A, and FIG. 1C is a sectional view taken along the line c—c of FIG. 1A.

FIGS. 2B1 through 2B5, and FIGS. 2C1 through 2C5 are views showing sectional views showing a sectional structure at various steps in a method for manufacturing a nonvolatile semiconductor memory device shown in FIGS. 1A through 1C.

FIGS. 6A through 6C are views showing a portion of the nonvolatile semiconductor memory device according to a second embodiment wherein FIG. 6A is a plan view thereof, FIG. 6B is a sectional view taken along the line b—b of FIG. 6A, and FIG. 6C is a sectional view taken along the line c—c.

FIGS. 7B1 through 7B5, FIGS. 7C1 through 7C5 are sectional views showing a sectional structure at various steps in a method for manufacturing the nonvolatile semiconductor memory device shown in FIGS. 6A through 6C.

FIGS. 8A through 8C are views showing a portion of the nonvolatile semiconductor memory device according to a third embodiment wherein FIG. 8A is a plan view thereof, FIG. 8B is a sectional view taken along the line b—b in FIG. 8A, and FIG. 8C is a sectional view taken along the line c—c.

FIGS. 9B1 through 9B5, and FIGS. 9C1 through 9C5 are sectional views showing a sectional structure at various steps in a method for manufacturing the nonvolatile semiconductor memory device shown in FIGS. 8A through 8C.

FIGS. 14B1 through 14B5 and FIGS. 14C1 through 14C5 are views showing a method for manufacturing a conventional self-alignment type device isolation memory cell of FIGS. 13A through 13C.

DETAILED DESCRIPTION OF THE INVENTION

Figure 1A:
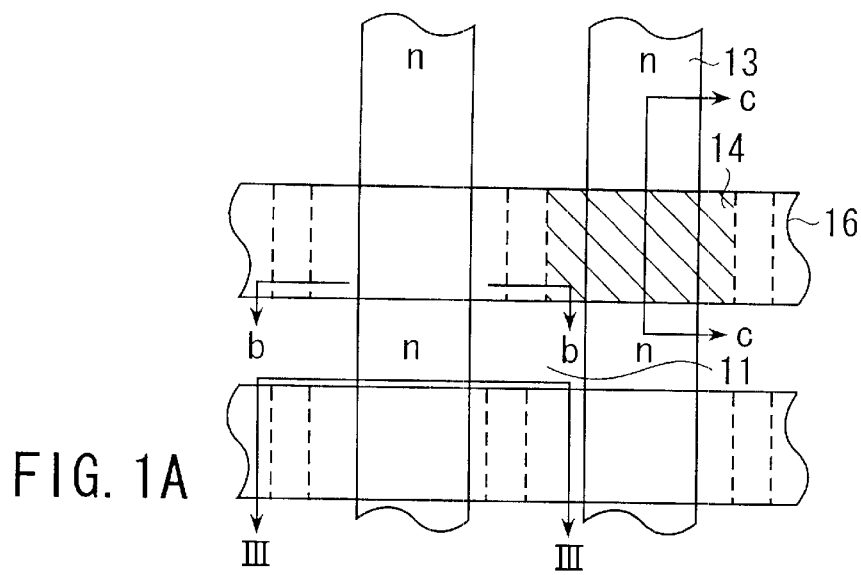

Embodiments of the present invention will be explained by referring to the drawings hereinafter.

Figure 1B:
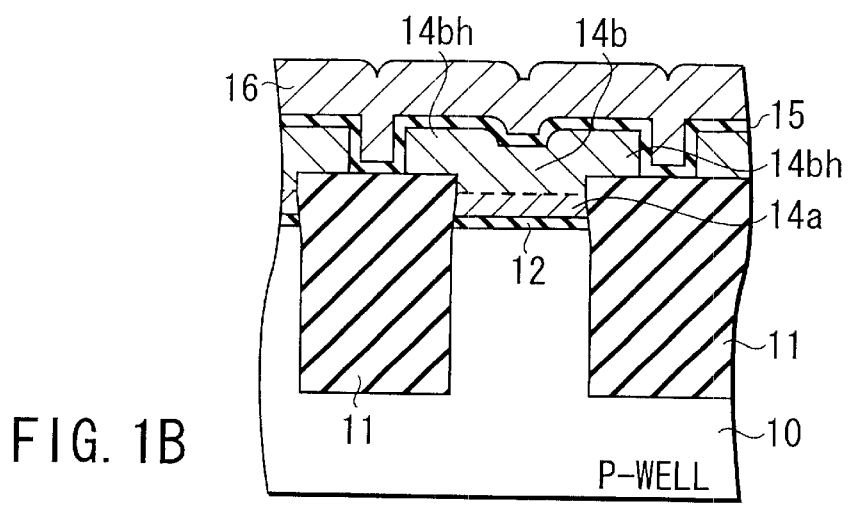
Figure 1C:
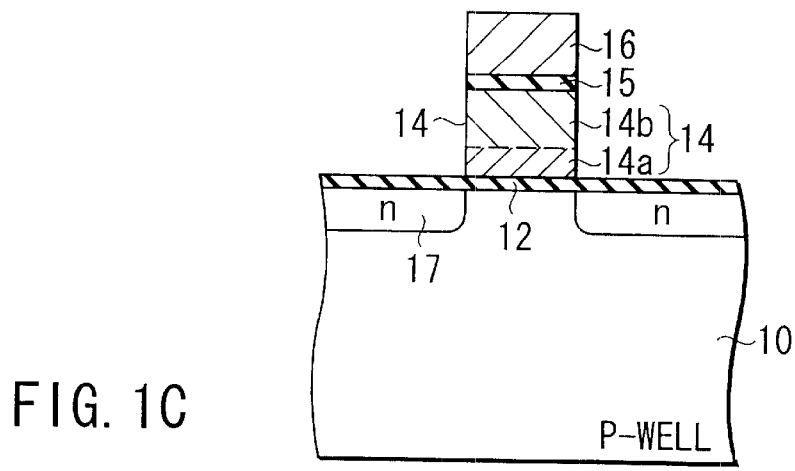

FIGS. 1A through 1C are views showing a nonvolatile semiconductor memory device according to one embodiment of the present invention. FIG. 1A is a plan view of a partial area of a memory array in the nonvolatile semiconductor memory device, FIG. 1B is a sectional view taken along the line b—b shown in FIG. 1A, and FIG. 1C is a sectional view taken along the line c—c shown in FIG. 1A.

In FIGS. 1A through 1C, a trench for the device isolation is formed in a p-well layer 10. Inside of this trench, an insulation material for the device isolation, for example, silicon dioxide material is buried so that a plurality of device isolation regions 11 are formed. On an overall surface of a device forming region 13 or the channel region on the p-well layer 10 which is device-isolated with such device isolation region 11, a thin tunnel insulation film 12 is formed which enables the tunnel current to flow between the P-well layer 10 and a charge accumulation region 14. On this thin tunnel insulation film 12, a conductive layer 14a of the region 14 is formed in such a manner that the layer 14a has side portions aligned with the device forming region 13.

On the conductive layer 14a, another conductive layer 14b is formed as a part of the charge accumulation region 14, so that the conductive layer 14a and the conductive layer 14b are electrically connected to have the same potential, thus forming a laminated layer or a multi-layered type charge accumulation layer 14. In addition, a control gate 16 is formed on the laminated type charge accumulation layer 14 via an insulation film 15 acting as an inter-gate film. The control gate 16 and the laminated type charge accumulation layer 14 are vertically processed in a self-aligning manner so that the side end portions are aligned with the so-called word lines or gate lines 16 with the result that the n-type diffusion layer 17 is formed in the device forming region 13 between the gates 16.

On the other hand, as shown in FIG. 1B, on a cross section vertical with respect to the so-called bit lines, the conductive layer 14b is cut on the device isolation region 11 by the inter-gate insulation film 15 so that the charge accumulation layer 14 is electrically divided for each of the memory cells. The bit lines are provided for supplying the potential to the diffusion layer 17 of the memory cell in the direction of the device forming region 13. The charge accumulation layer 14 is capacity-coupled with the control gate 16 via the inter-gate insulation film 15 between the charge accumulation region 14 acting as a floating gate and the control gate 16.

In the charge accumulation layer 14, the conductive layer 14a sandwiched with the device isolation regions 11 has side walls as inclined surfaces so that the width of the layer 14a between the regions 11 at lower end thereof is wider than the width at an upper end thereof, and a taper angle formed by the inclined side wall and the bottom surface of the conductive layer 14a is 80 degrees or more and less than 90 degrees.

According to the taper formed in the conductive layer 14a of the charge accumulation layer 14, the characteristic of a buried configuration of the device isolation region 11 adjacent to the charge accumulation layer 14 is improved to prevent the formation of voids, for example, and the width of the device isolation can be decreased to 0.25 μm or less.

Further, the residue of the conductive layer on the side end of the device isolation region 11 at the time of the gate processing can be completely removed by setting the taper angle of the conductive layer 14a to be 80 degrees or more and less than 90 degrees. The side walls of the conductive layer 14a are set to a tapered configuration with the result that the buried configuration of the device isolation region 11 is improved and the memory cell having the control gate width of 0.2 μm can be isolated. Furthermore, a trench can be buried without forming voids within the memory cell array even if the trench is formed deeper than the trench formed in a peripheral transistor region.

Incidentally, a channel region is formed immediately below the tunnel insulation film 12 formed between the device isolation regions 11 shown in FIG. 1B. When the channel width which is a distance between two adjacent device isolation regions 11 is denoted by W as shown in FIG. 1B, and the channel length which is a distance between the n-type diffusion layers 17 as shown in FIG. 1C is denoted by L, the fact that the value of W/L is 1 or less is a feature of the gate portion in the present embodiment.

FIGS. 2B1 through 2B5 and 2C1 through 2C5 are explanatory views of a procedure of steps of manufacturing a memory cell array having a structure shown in FIGS. 1A through 1C. FIGS. 2B1 through 2B5 are sectional views taken along the line b—b of FIG. 1A at the respective steps. FIGS. 2C1 through 2C5 are sectional views taken along the line c—c of FIG. 1A at the respective steps corresponding to those of FIGS. 2B1 to 2B5.

As shown in FIGS. 2B1 and 2C1, a first conductive layer 14a is formed, for example, on the p-well layer 10 via a first gate insulation layer 12 which forms the tunnel insulation film, and a resist film as a mask material 21 is formed which constitutes a processing mask for the conductive layer 14a.

Next, as shown in FIGS. 2B2 and 2C2, the mask material 21 and the first conductive layer 14a are patterned by using a well-known lithography technique, so that the mask material 21 and the conductive layer 14a are remained on the device forming region 13 but removed on the region where the device isolation region 11 is to be formed. As a consequence, the residual mask material 21 is used to remove the gate insulation film 12 and a corresponding portion of the p-well layer 10 by dry-etching technique thereby forming trenches 22 on both sides of the mask 21.

At the time of dry-etching, it becomes possible to form the conductive layer 14a in a tapered configuration by setting the width between the side walls at the lower end of the conductive layer 14a wider than the width of the upper end of the conductive layer 14a through an appropriate selection of the etching condition.

At this time, the trench 22 and the lower ends of the side walls of the first conductive layer 14a are aligned to each other. Furthermore, the depth of the trench 22 can be selected in accordance with the desired withstand voltage for the device isolation.

Next, after a cleaning treatment or appropriate surface treatment is conducted, as shown in FIGS. 2B3 and 2C3, the insulation film 11 for the device isolation is buried in the trench 22 and the buried film 11 is planarized where the thickness of the film is adjusted by polishing, etch-back or the like. Thus, the device isolation region 11 is completed.

By forming a taper on the side walls of the conductive layer 14a facing the device isolation region 11, it is possible to form the device isolation region 11 without generation of a void or the like in the case where the buried aspect ratio is high. Consequently, even in the case where the width of the conductive layer 14a sandwiched with the device isolation regions 11 is not more than 0.25 μm, and in the case where the width of the device isolation regions 11 is equal to or less than 0.25 μm, the device isolation regions 11 can be buried satisfactorily. Furthermore, even in the case in which the depth of the trench 22 is more than 0.1 μm, the device isolation regions can be buried sufficiently.

Next, as shown in FIGS. 2B4 and 2C4, after the mask material 21 is removed, the second conductive layer 14b is directly formed on the conductive layer 14a. As shown in FIG. 2B4, the conductive layer 14b is cut with the slit 23 on the device isolation regions 11 to separate the charge accumulation layer 13 for each of the memory cells.

Lastly, as shown in FIGS. 2B5 and 2C5, the second gate insulation film 15 and the conductive film which forms the control gate 16 are formed in the order mentioned, followed by processing collectively the control gate 16, the second gate insulation film 15 and the charge accumulation layer 14 in a direction of intersecting the device forming region 13 by dry etching method. As a consequence, as shown in FIG. 2C5, the side end portions in the direction of word lines of the respective members 14, 15 and 16 are aligned.

Figure 3A:
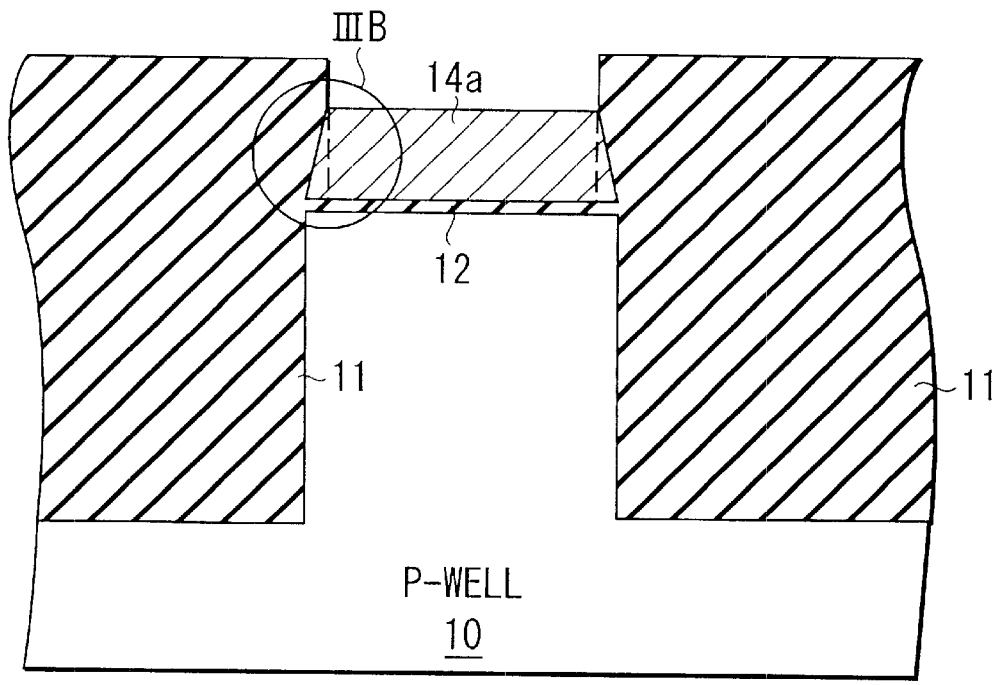
FIGS. 3A and 3B are sectional views taken along the line III—III of FIG. 1 and enlarged views of a residual portion of a conductive layer.
Figure 3B:
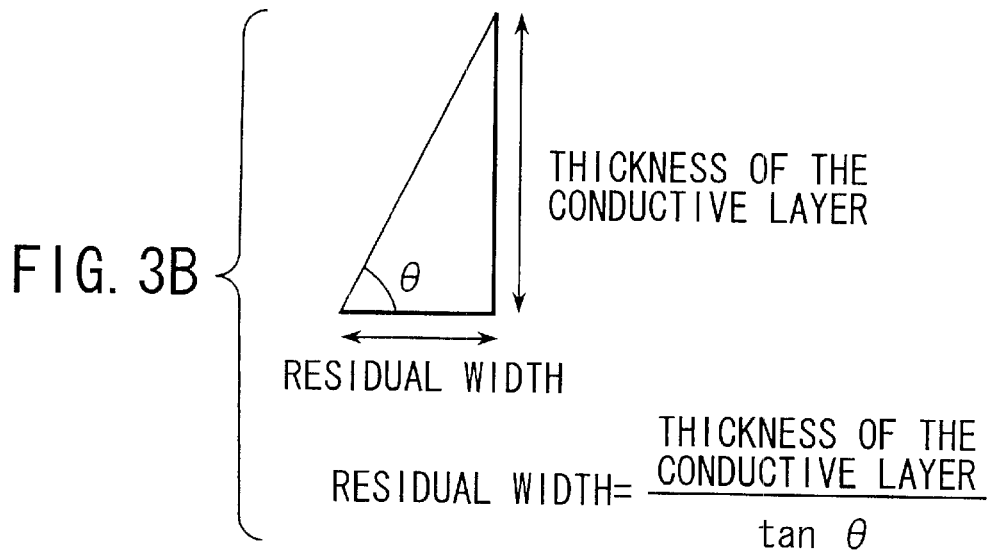

Here, by referring to FIGS. 3A and 3B, the tapered side walls formed on the conductive layer 14a will be explained in detail. FIG. 3A is a sectional view taken along the line III—III of FIG. 1A, and FIG. 3B is an enlarged view of the encircled portion IIIB shown in FIG. 3A for reciting the tapered portion of the conductive layer 14a.

In the case where the conductive layer 14a is formed in a tapered configuration, a part of the upper part of the conductive layer 14a is covered with the side walls at the upper part of the device isolation region 11. Consequently, at the time of processing the gates, there is a possibility that the region shown by slashed lines of the conductive layer 14a becomes a residue. This becomes conspicuous because the etching rate abruptly lowers when the gate width and the interval between the gates becomes 0.2 $\mu$m or less with the refinement thereof.

It has been made clear that it is effective to control the taper angle $\theta$ of the conductive layer 14a to be 80 degrees or more and less than 90 degrees in order to solve this problem. In the case where the thickness of the conductive layer 14a is set to 0.1 $\mu$m, the maximum width of the residue of the conductive layer 14a under the device isolation region 11 is in the order of 0.02 $\mu$m, for example, so that it becomes sufficiently possible to remove the residue by means of the side wall oxidation processing after the gate forming process is completed.

As an advantage of forming the side walls of the conductive layer 14a facing the device isolation region 11 in a tapered configuration, it is possible to cite the fact that the channel width can be set to be wide because the width of the device isolation regions 11 can be formed to have a more narrow size.

Generally, since the threshold voltage of the memory cell decreases with the short channel effect when the channel width, namely the gate width is 0.2 $\mu$m or less, the cut-off characteristic of the memory cell transistor is extremely deteriorated. It is known that the threshold voltage can be lowered as the channel width is narrower in the case where the trench device isolation is used as a device isolation method. Consequently, the deterioration in characteristic is represented conspicuously with the refinement of the channel length and the channel width.

On the other hand, in the present invention, the gate width, namely, the channel width can be widened by forming the side walls of the conductive layer 14a facing the device isolation region 11 in a tapered configuration with the result that the channel length is substantially enlarged thereby making it possible to suppress a decrease in the threshold voltage and to make an attempt of refining the memory cell.

Here, there will be explained a reason why it is effective to control the taper angle $\theta$ of the conductive layer 14a to be 80 degrees or more and less than 90 degrees by referring to FIGS. 4A through 4D, and FIGS. 5A through 5D.

FIGS. 4A through 4D are views for explaining the fact that setting the taper angle $\theta$ to 80 degrees or more at 0<gate width$\leq$0.2 $\mu$m and 0<thickness of the conductive layer 14a <0.1 $\mu$m is very effective for improving the short-circuiting failure resulting from the residue of the conductive layer at the time of processing the gates.

Figure 4A:
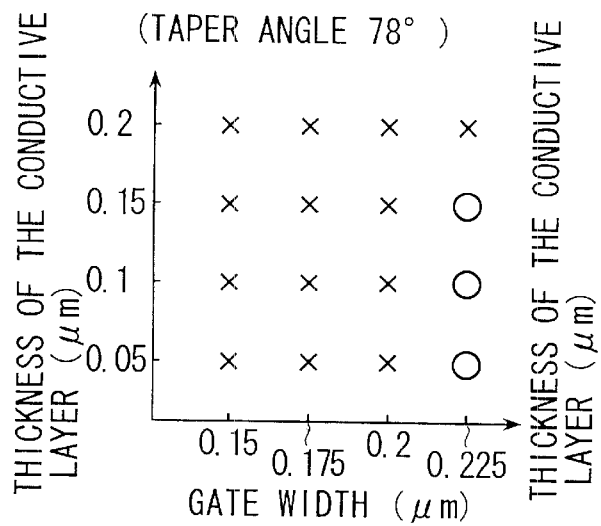
FIGS. 4A through 4D are views showing result data which is obtained from the verification of a short-circuiting failure resulting from the residue of a conductive layer at the time of processing gates at various taper angles.
Figure 4B:
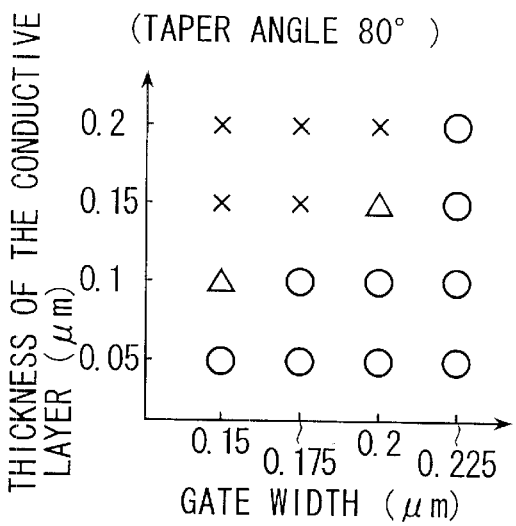
Figure 4C:
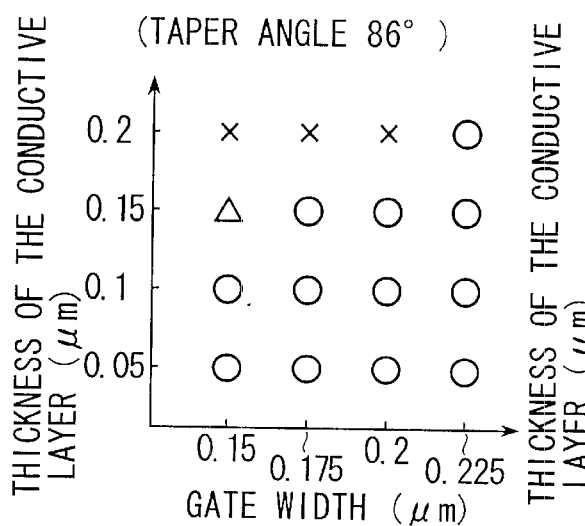
Figure 4D:
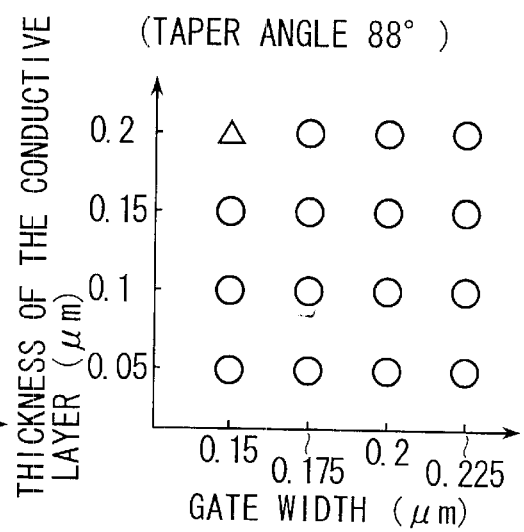

FIG. 4A is a view showing a case in which the taper angle is 78 degrees, FIG. 4B is a view showing a case in which the taper angle is 80 degrees, FIG. 4C is a view showing a case in which the taper angle is 86 degrees and FIG. 4D is a view showing a case in which the taper angle is 88 degrees respectively. In the figures, symbol ◯ denotes no short-circuiting failure, symbol Δ denotes 50% short-circuiting failure, and symbol × denotes 100% short-circuiting failure. Incidentally, the ordinate in the drawing denotes a film thickness ($\mu$m) of the conductive layer 14a, and the abscissa denotes the gate width ($\mu$m).

As a result of the experiment, in the case where a memory cell having a gate length of 0.2 $\mu$m is formed, no effect can be substantially observed at the taper angle of 78 degrees. In contrast, in all the cases in which the taper angle is set to 80 degrees or more (80 degrees, 86 degrees, and 88 degrees), a conspicuous effect can be observed. That is, in conclusion, it has been verified that setting the taper angle to 80 degrees or more at 0<gate width$\leq$0.2 $\mu$m and at 0<the thickness of the conductive layer$\leq$0.1 $\mu$m is extremely effective to prevent the short-circuiting failure resulting from the residue of the conductive layer 14a at the time of processing the gates.

Next, by referring to FIGS. 5A through 5D, it has been made clear that setting the taper angle to less than 90 degrees at 0<device isolation width$\leq$0.25 $\mu$m and at the depth of the trench$\geq$0.1 $\mu$m is extremely effective in the improvement in the buried configuration.

Figure 5A:
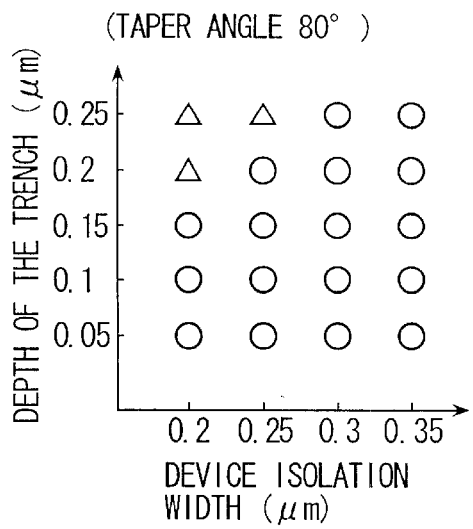
FIGS. 5A through 5D are views showing result data which is obtained from the verification of voids generated inside of the trench at various taper angles.
Figure 5B:
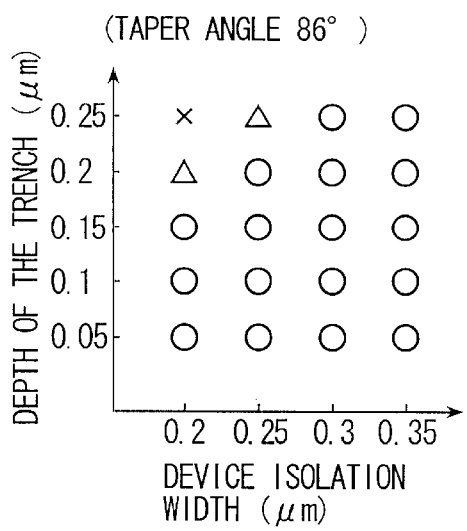
Figure 5C:
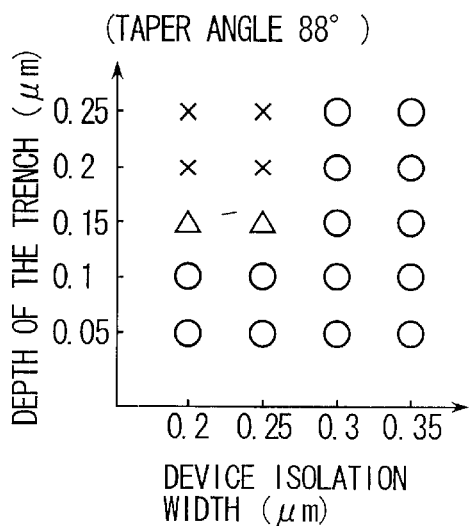
Figure 5D:
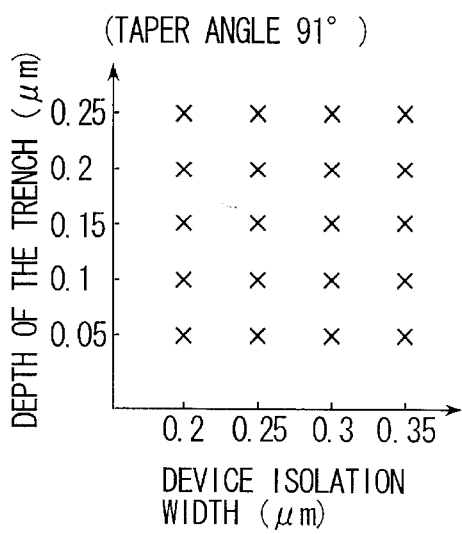

FIGS. 5A through 5D are views showing the result of the experiment on how the voids are generated or not generated in the trench with respect to the taper angle. FIG. 5A shows a case in which the taper angle is 80 degrees, FIG. 5B shows a case in which the taper angle is 86 degrees, FIG. 5C shows a case in which the taper angle is 88 degrees and FIG. 5D shows a case in which the taper angle is 91 degrees, respectively. In the drawings, symbol ◯ denotes no voids, symbol Δ denotes the generation of 50% voids, and symbol × denotes the generation of 100% voids. Incidentally, in the drawing, the ordinate denotes the depth of the trench ($\mu$m), and the abscissa denotes the device isolation width ($\mu$m).

As a result of the experiment, when the taper angle is 91 degrees, the voids are generated 100% irrespective of the width of the device isolation and the depth of the trench. Thus no effect can be observed at all. However, when the taper angle is less than 90 degrees (88 degrees, 86 degrees and 80 degrees), the generation of voids is suppressed and a conspicuous effect can be observed in any of the cases. That is, in conclusion, it has been verified that the voids can be eliminated by setting the taper angle to less than 90 degrees at 0<width of the device isolation$\leq$0.25 $\mu$m and at the depth of the trench$\geq$0.1 $\mu$m thereby significantly improving the buried configuration.

Incidentally, because of an error in the manufacture thereof, the taper angle has an error of ±1 degree. For example, in the case of FIG. 4D, the taper angle is actually 88°±1°, namely, the range of 87° to 89° is included therein. Furthermore, in the case of FIG. 5D, the range of 90° to 92° is included therein, and in the case of FIG. 5C, the range of 87° to 89° are included therein.

Through the above manufacturing process, while the trench burying characteristic of the insulation film for the device isolation is improved by forming the side walls of the conductive layer which is a part of the charge accumulation layer into a tapered configuration having 80 degrees or more and less than 90 degrees, the angle can be controlled to a level at which no residue of the conductive layer 14a is generated at the side end of the device isolation regions at the time of processing the gates with the result that the processing control characteristic of the nonvolatile semiconductor memory device having a device isolation of 0.25 μm or less, and the gate length and the gate interval of 0.2 μm or less can be significantly improved.

Figure 6A:
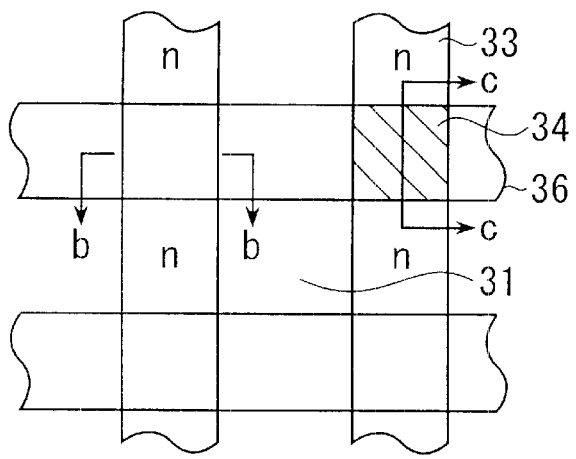
Figure 6B:
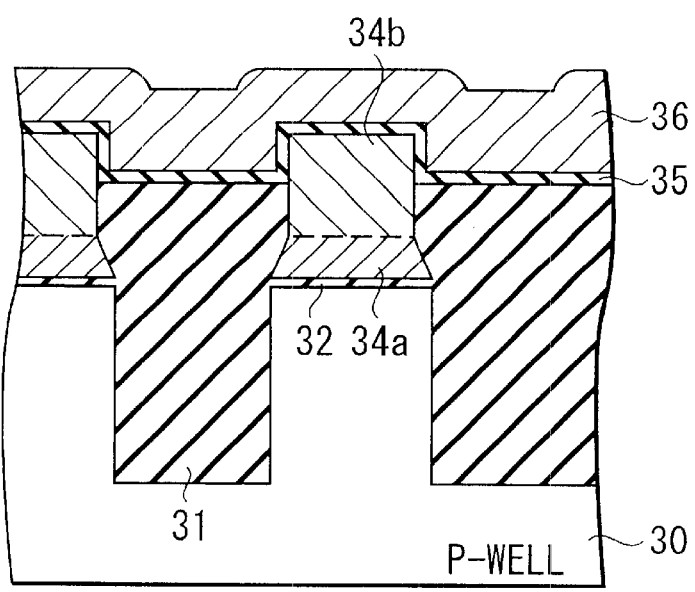
Figure 6C:
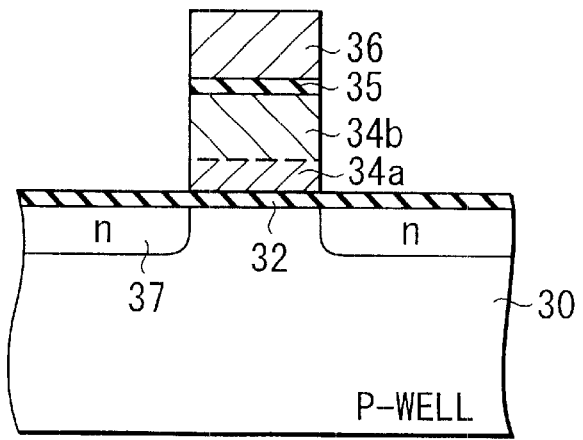

FIGS. 6A through 6C are views showing a nonvolatile semiconductor memory device according to another embodiment of the present invention. FIG. 6A is a plan view thereof, FIG. 6B is a sectional view taken along the line b—b in FIG. 6A, and FIG. 6c is a sectional view taken along the line c—c in FIG. 6A. In the device structure shown in FIGS. 6A–6C, in the same manner as the device structure shown in FIGS. 1A–1C, the lower end portion of each side wall of the conductive layer 34a is formed in alignment with the device isolation region 31. However, the configuration of another conductive layer 34b arranged on the conductive layer 34a has a different structure from that shown in FIGS. 1A through 1C.

That is, in FIGS. 1A through 1C, the upper conductive layer 14b has a structure having a projecting portion 14b h which projects in the lateral direction above the device isolation region 11. The device structure shown in FIGS. 6A through 6C is constituted such that a lower part of the conductive layer 34b is sandwiched by the adjacent two device isolation regions 31 in the similar manner as the case of FIGS. 1A to 1C. However, the upper portion of the layer 34b is not projected in the lateral direction but projected in the upper direction straightly into the control gate 36 with the same width as the lower part of the layer 34b. This upper portion has side walls facing the control gate 36 via the insulation film 35 acting as the inter-gate insulation film.

The conductive layer 34a sandwiched with the device isolation regions 31 has side walls formed as inclined surfaces so that the width of the lower end thereof is wider than the width of the upper end, and the taper angle formed between the inclined surface and the bottom surface of the conductive layer 34a is controlled to be 80 degrees or more and less than 90 degrees.

Consequently, in the same manner as the embodiment shown in FIGS. 1A through 1C, the burying configuration of the device isolation regions 31 adjacent to the charge accumulation layer 34 is improved so that the device isolation width of 0.25 μm or less is made possible without voids. Further, the residue of the conductive layer at the side end of the device isolation regions at the time of gate processing is completely removed by setting the taper angle of the conductive layer 34a to be 80 degrees or more and less than 90 degrees. Then, the buried configuration is improved by forming the side walls of the conductive layer in the tapered configuration, so that the device isolation of the memory cell having a control gate width of 0.2 μm or less is made possible. Furthermore, the deeper trench forming is made possible without forming the voids in the cell array region than the trench formed in the peripheral transistor region.

FIGS. 7B1 through 7B5, and 7C1 through 7C5 are explanatory views showing a procedure steps for manufacturing the memory cell having a structure shown in FIGS. 6A through 6C. FIGS. 7B1 through 7B5 are sectional views taken along the line b—b of FIG. 6A at each step thereof whereas FIGS. 7C1 through 7C5 are sectional views taken along the line c—c of FIG. 6A at each step corresponding to FIGS. 7B1 through 7B5.

As shown in FIGS. 7B1 and 7C1, the first conductive layer 34a is formed, for example, on the p-well layer 30 via the first gate insulation film 32 which forms a tunnel insulation film, and a mask material 41 is formed which constitutes a mask for processing the conductive layer 34a.

Next, as shown in FIGS. 7B2 and 7C2, the mask material 41 and the first conductive layer 34a are patterned by using the lithography technique, so that the mask material 41 and the conductive layer 34a are retained on the device forming region 33, and the mask material 41 and the conductive layer 34a on the region where the device isolation region 31 is to be formed are removed.

As a consequence, trenches 42 are formed by removing the first gate insulation film 32 and the corresponding portions of the p-well layer 30 by means of dry etching by using the remaining mask material 41. The width of the lower end of the conductive layer 34a is made wider than the width of the upper end of the conductive layer 34a by appropriately selecting the etching condition at the time of dry etching with the result that the conductive layer 34a can be formed into the tapered configuration. At this time, the trench 42 and the side end portion of the conductive layer 34a are aligned. Furthermore, the depth of the trench 42 can be selected in alignment with the desired device isolation voltage or withstand voltage.

Next, after cleaning treatment or an appropriate surface treatment is conducted, as shown in FIGS. 7B3 and 7C3, the insulation film 31 for device isolation is buried in the trench 42, and the buried film 31 is planarized by polishing and etch-back or the like, and the thickness of the film is adjusted with the result that the device isolation region 31 is completed.

Next, as shown in FIGS. 7B4 and 7C4, after the mask material 41 is removed, the conductive material which forms the second conductive layer 34b is directly formed on the conductive layer 34a, and the conductive material is planarized by polishing or the like, and the conductive layer 34b is formed on the region of the mask material 41. Then, the insulation film 31 for the device isolation is etched back so that a part of the side of the conductive layer 34b is exposed, and the charge accumulation layer 34 is isolated and formed for each of the memory cells.

Lastly, as shown in FIGS. 7B5 and 7C5, the second gate insulation film 35 and the conductive film which forms the control gate 36 are formed, so that the control gate 36, the second gate insulation film 35, and the charge accumulation layer 34 are processed collectively in a direction of intersecting the device formation region 33 by dry etching. As a consequence, as shown in FIG. 7C5, the side end portions are aligned in the word line direction of each of the members 34, 35 and 36.

Figure 8A:
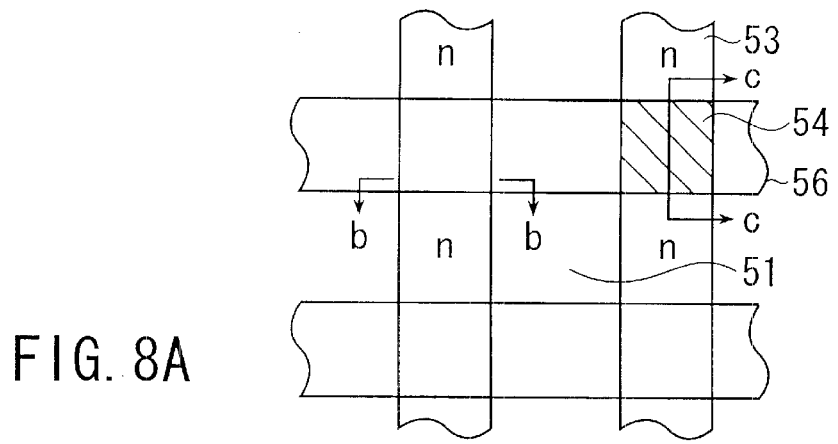
Figure 8B:
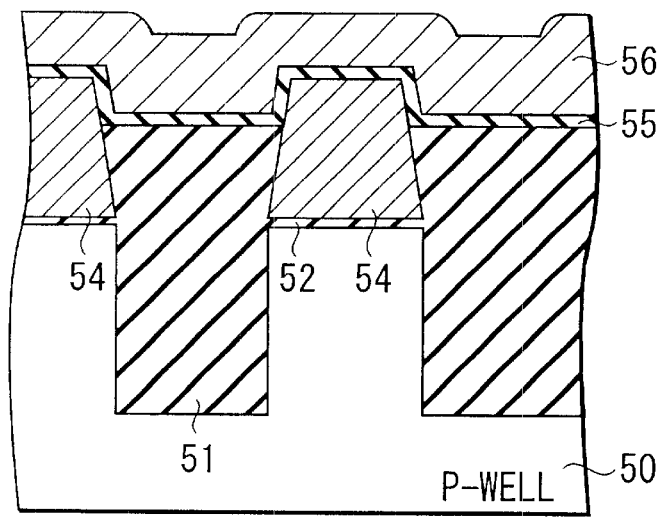
Figure 8C:
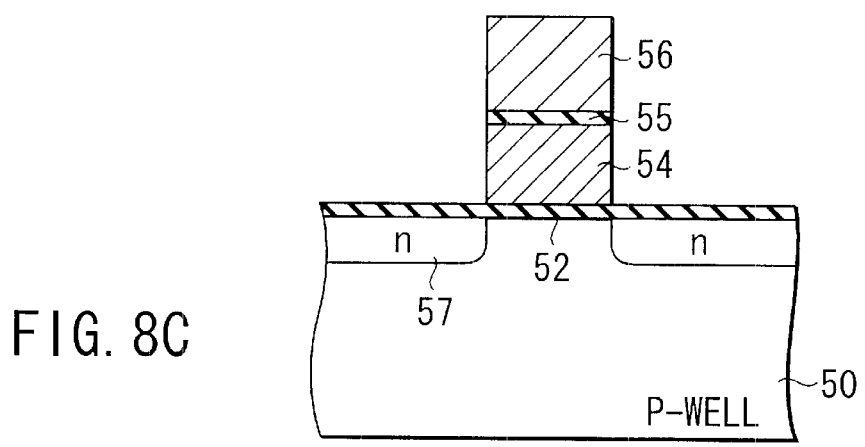

FIGS. 8A–8C are views showing the nonvolatile semiconductor memory device according to still another embodiment of the present invention. FIG. 8A is a plan view thereof, FIG. 8B is a sectional view taken along the line b—b, and FIG. 8C is a sectional view taken along the line c—c.

In the device structure shown in FIGS. 8A through 8C, the charge accumulation layer 54 is formed as a single conductive layer, and lower end portions of the side walls of the charge accumulation layer 54 is formed in alignment with the device isolation region 51 in such a manner that the lower portions of the side walls of the charge accumulation layer 54 are constituted to contact with the sides of the device isolation regions 51. Then, an upper portion of the layer 54 is projected into a recess of the control gate 56 via the insulation film 55 acting the inter-gate insulation film such that the upper portions of the side walls of the layer 54 face the control gate 56 via the insulation film 55.

The cross section structure of the films 54 to 56 cut in direction of the bit lines is formed in the similar manner as in the case of FIG. 1C, as shown in FIG. 8C.

The side walls of the charge accumulation layer 54 sandwiched with the device isolation regions 51 are formed as inclined surfaces in such a manner that the width of the lower end becomes wider than the width of the upper en d thereof. Then the taper angle formed with the inclined surface and the bottom surface of the conductive layer 54 is controlled to be 80 degrees or more and less than 90 degrees.

Consequently, the following results are obtained.
a) The buried configuration of the device isolation region adjacent to the charge accumulation layer is improved in the same manner as the embodiment shown i n FIGS. 6A through 6C.
b) The device isolation width of 0.25 µm or less is made possible.
c) The residue of the charge accumulation layer on the side end of the device isolation region at the time of gate processing can be completely removed by setting the taper angle of the charge accumulation layer 54 to be at 80 degrees or more and less than 90 degrees.
d) The buried configuration is improved by forming the side walls of the charge accumulation layer into the tapered configuration.
e) The device isolation of the memory cell having the control gate width of 0.2 µm or less is made possible.
f) Furthermore, forming the trench is made possible without forming voids in the memory cell array formed deeper than the trench formed in the peripheral transistor.

FIGS. 9B1 through 9B5, and 9C1 through 9C5 are views for explaining the procedure of steps of manufacturing the memory cell having a structure shown in FIGS. 8A through 8C.

FIGS. 9B1 through 9B5 on the left row in the drawing are sectional views taken along the line b—b of FIG. 8A at each step whereas FIGS. 9C1 through 9C5 are sectional views taken along the line c—c of FIG. 8A at each step.

As shown in FIGS. 9B1 and 9C1, the charge accumulation layer 54 is formed via the first gate insulation film 52 which forms the tunnel insulation film, for example, on the p-well layer 50, and a mask material 58 is formed which forms the processing mask of the charge accumulation layer 54.

Next, as shown in FIGS. 9B2 and 9C2, the mask material 58 and the charge accumulation layer 54 are retained on the device forming region 53 by patterning the mask material 58 and the charge accumulation layer 54 by using the lithography technique, so that the mask material 58 and the charge accumulation layer 54 on the region where the device isolation region 51 is to be formed are removed. Consequently, the first gate insulation film 52 and the corresponding portions of the p-well layer 50 are removed by dry etching by using this remaining mask 58 to form the trench 59.

The charge accumulation layer 54 can be formed into a tapered configuration by making the width of the lower end of the charge accumulation layer 54 wider than the width of the upper end of the charge accumulation layer 54 through appropriately selecting the etching condition at the time of dry etching. At this time, the lower end portions of the trench 59 and the charge accumulation layer 54 can be aligned. Furthermore, the depth of the trench 59 can be selected in accordance with the desired device isolation voltage or withstand voltage.

Next, after a cleaning treatment or an appropriate surface treatment is conducted, as shown in FIGS. 9B3 and 9C3, the insulation film 51 for the device isolation is buried in the trench 59, and the buried film 51 is planarized by polishing, etch-back or the like, and the thickness of the film is adjusted with the result that the device isolation region 51 is completed.

Next, as shown in FIGS. 9B4 and 9C4, the insulation film 51 for the device isolation is etched back so that a portion of the side of the charge accumulation layer 54 is exposed to separate the charge accumulation layer 54 for each of the memory cells followed by removing the mask material 58.

Lastly, as shown in FIGS. 9B5 and 9C5, after the insulation film 55 between the gates and the conductive film which forms the control gate 56 are formed, the control gate 56, the insulation film 55 between the gates, and the charge accumulation layer 54 are processed collectively in a direction of intersecting the device formation region 53 by dry etching with the result that the side end portion of each of the members 54, 55 and 56 in the direction of word lines are aligned as shown in FIG. 9C5.

Figure 10:
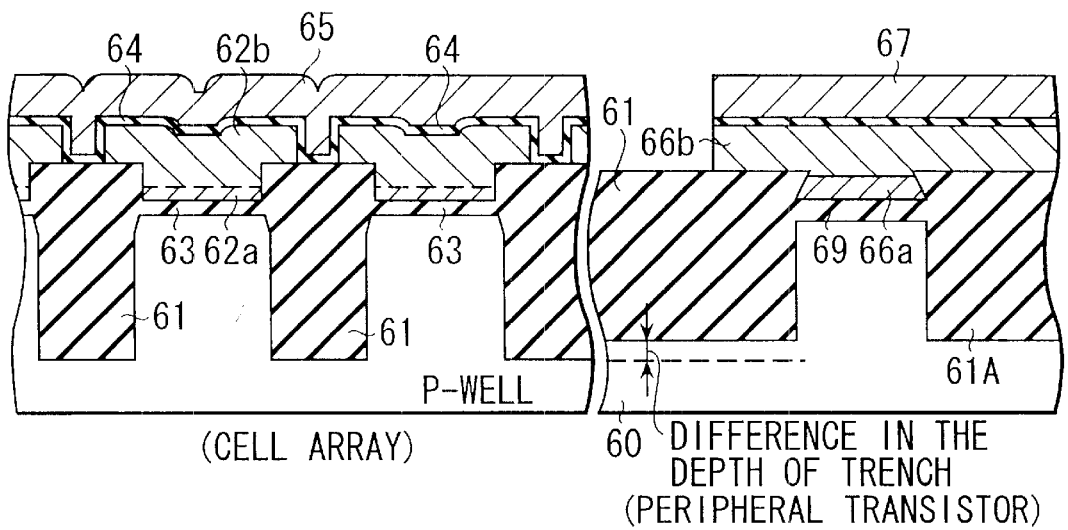
FIG. 10 is a sectional view for explaining a difference in a depth of the trench between a memory cell formation portion and a peripheral circuit portion.
Figure 12:
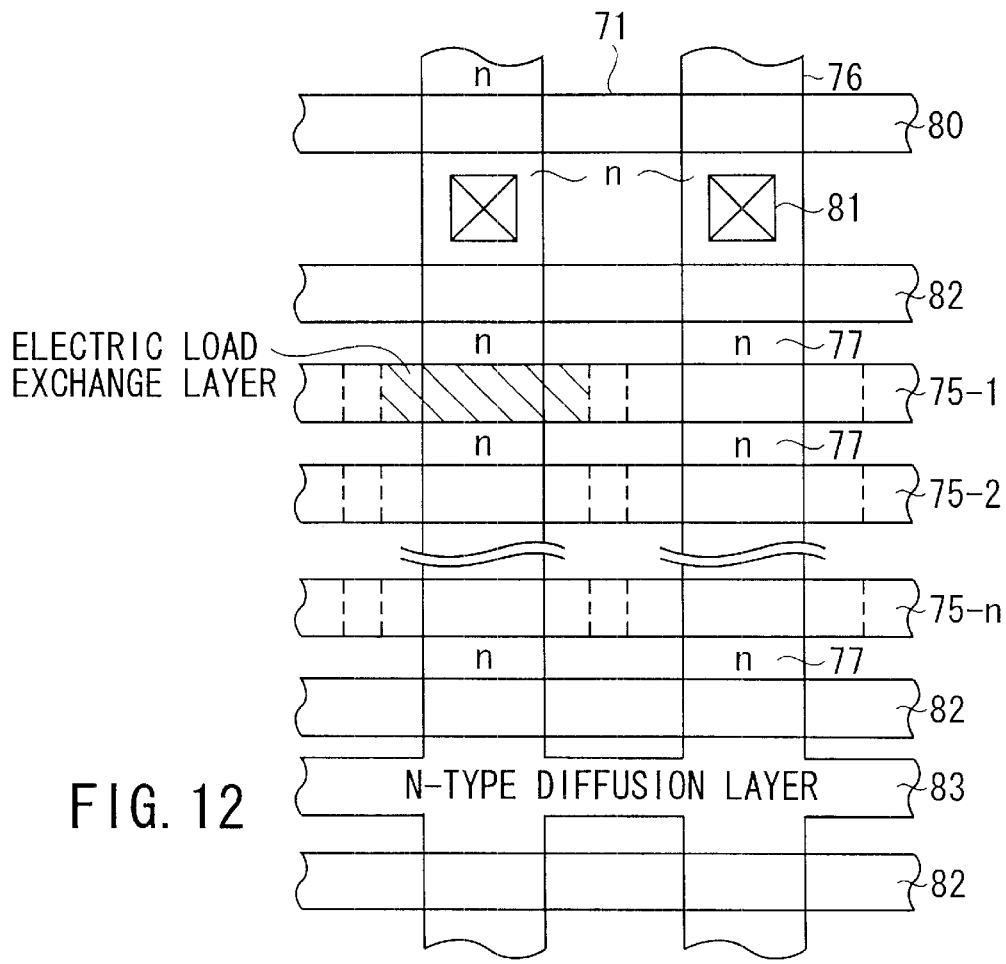
FIG. 12 is a plan view showing a memory cell array having a conventional NAND structure.
Figure 11A:
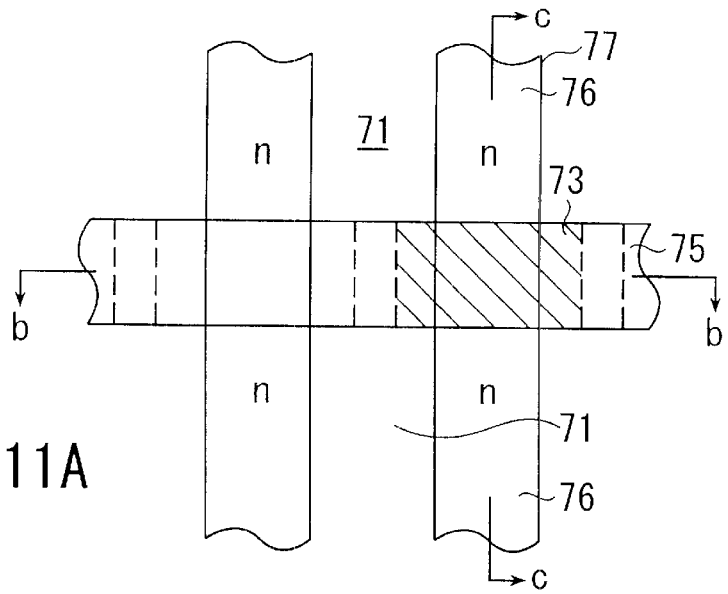
FIGS. 11A through 11C are a plan view and a sectional view showing a memory cell having a conventional stack gate structure.
Figure 11B:
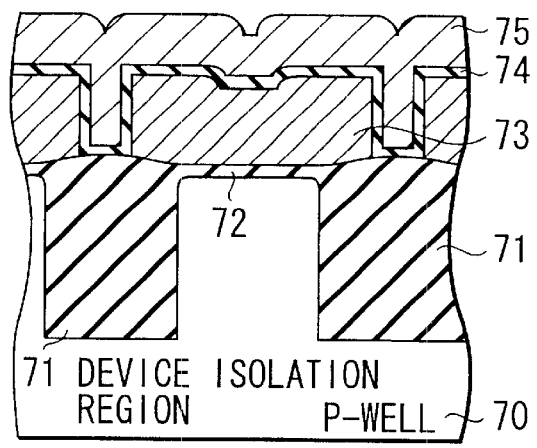
Figure 11C:
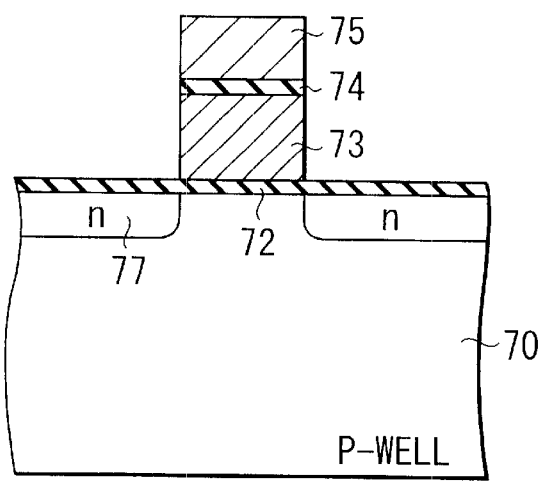
Figure 13A:
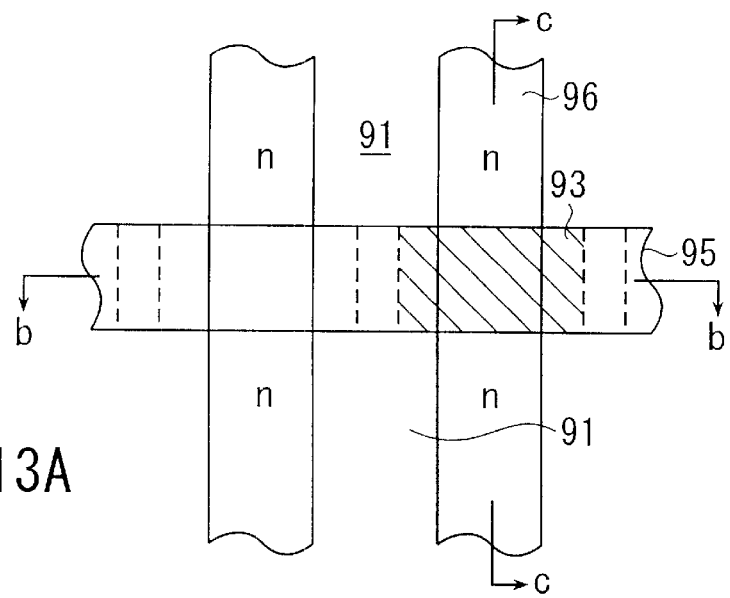
FIGS. 13A through 13C are a plan view and a sectional view showing a structure of a memory cell using a conventional self-alignment type device isolation method.
Figure 13B:
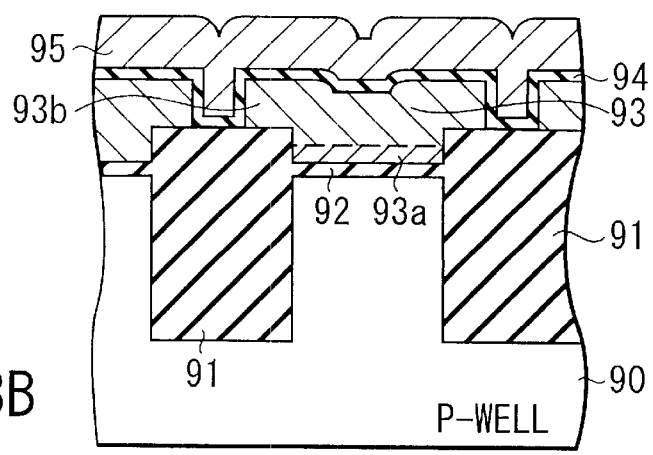
Figure 13C:
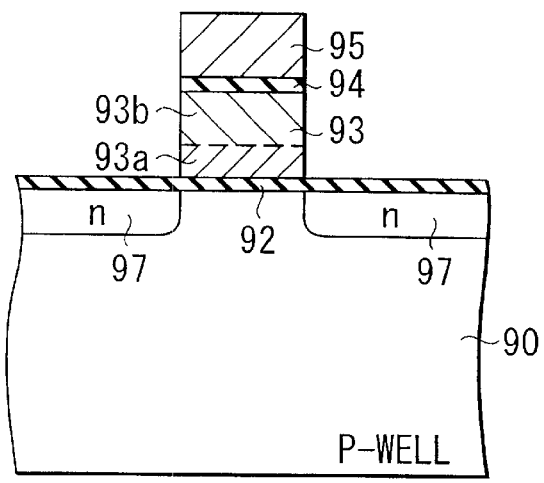

FIG. 10 is a view showing the nonvolatile semiconductor memory device according to still another embodiment. In FIG. 10, the thickness of the first gate insulation film 63 under the conductive layer 62 in the memory cell array formed inside of the p-well layer 60 is, for example, 100 Å. Compared with this, the peripheral circuit portion of the semiconductor integrated semiconductor device includes a peripheral transistor in which the thickness of the third gate insulation film 69 under the conductive layer 66a is very thick in the order of, for example, 200 Å. In this manner, since there is a difference in the thickness of the gate insulation film, there is a tendency that the trench in the memory cell array, namely, the insulation film 61 for the device isolation becomes thicker than the insulation film 61A for the device isolation in the peripheral circuit portion in the case where the devices are manufactured in the above processing method.

This is because the first gate insulation film 63 is first removed in the memory cell array before the removal of the third gate insulation film 69 when the first gate insulation film 63 and the third gate insulation film 69 are etched at the time of the formation of the trench with the result that either the silicon substrate or p-well layer 60 is etched. That is, there arises a problem that the trench of the memory cell array having the highest aspect ratio is deepest.

With respect to such a problem, according to the present invention, it becomes possible to secure sufficiently the controllability because the buried characteristic can be improved by forming the conductive layer into a tapered configuration.

The present invention is not restricted to each of the embodiments described above. In the semiconductor memory device for the trench device isolation by means of the self-aligning method, particularly, the nonvolatile semiconductor memory device having a stack gate structure, the invention is extremely effective when the width of the device isolation region is larger than 0 and 0.25 µm or less, and the gate length is larger than 0 and 0.2 µm or less.

Furthermore, the present invention can be variously modified and practiced within the scope not departing from the gist of the invention.

As described in detail, according to the present invention, while the buried characteristic of the device isolation region is improved by forming a taper having an angle of 80 degrees or more and less than 90 degrees, the angle being formed on the side of the conductive layer which is a part of the charge accumulation layer facing the device isolation region with the bottom surface of the charge accumulation layer, the device isolation region can be controlled so as not to generate a residue at the side end of the device isolation region at the time of processing the gates with the result that the processing control characteristic of the nonvolatile semiconductor memory device can be remarkably improved which has a device isolation region width of 0.25 µm or less and a gate length of 0.2 µm or less, and a large capacity, high density and low cost nonvolatile semiconductor memory device can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device in which a plurality of memory cells are arranged in an array-like configuration to constitute a cell array having a plurality of device isolation regions buried by an insulation material in trenches formed in a semiconductor substrate, and a plurality of device forming regions each of which is divided with the device isolation regions, and in which each of the memory cells includes a floating gate formed via a first gate insulation film on the device forming region, and a control gate formed on the floating gate via a second gate insulation film, wherein at least a portion of the floating gate sandwiched with the device isolation regions has a lower end contacting with a surface of the semiconductor substrate via the first gate insulation film with a width larger than that of an upper end of the sandwiched portion, and the device isolation regions each has a width of 0.25 µm or less.

2. The nonvolatile semiconductor memory device according to claim 1, wherein the portion of the floating gate has at least an inclined side wall facing the device isolation region, and a taper angle formed by the inclined side wall and a bottom surface of the floating gate facing the first gate insulation film is 80 degrees or more and less than 90 degrees.

3. The nonvolatile semiconductor device according to claim 1, wherein the thickness of the floating gate is 0.1 µm or less.

4. The nonvolatile semiconductor device according to claim 1, wherein the width of the upper end of the portion of the floating gate facing the device isolation regions is less than 0.25 µm.

5. The nonvolatile semiconductor device according to claim 1, wherein a relationship that W/L is 1 or less stands, where a channel length of a memory cell formed beneath the first gate insulation film is denoted by L and a channel width is denoted by W.

6. The nonvolatile semiconductor memory device according to claim 1, wherein a depth of the trench is 0.1 µm or more and less than 0.3 µm.

7. The nonvolatile semiconductor memory device according to claim 1, wherein the floating gate includes a projected portion over the device isolation regions continued to the upper end of the portion sandwiched with the device isolation regions.

8. The nonvolatile semiconductor memory device according to claim 1, wherein the floating gate includes an extended portion extended in a straight line continued to the upper end of the portion sandwiched with the device isolation regions.

9. A nonvolatile semiconductor memory device in which a plurality of memory cells are arranged in an array-like configuration to constitute a cell array including a plurality of device isolation regions buried by an insulation material in trenches formed in a semiconductor substrate, and a plurality of device forming regions each of which is divided with the device isolation regions, and in which each of the memory cells has a floating gate including a conductive layer formed on a first gate insulation film in the device forming region, the conductive layer has side walls each being arranged in alignment with the device forming region, and a control gate is formed on the floating gate via a second gate insulation film, wherein:

the width at a lower end of the side walls of the conductive layer is wider than a width at an upper end of the side walls, at least one of the side walls is formed in a tapered configuration, and a taper angle formed between the tapered side wall and the bottom surface of the conductive layer is 80 degrees or more and less than 90 degrees, and the control gate has a width of 0.2 µm or less.

10. The nonvolatile semiconductor memory device according to claim 9, wherein the floating gate has a multi-layered structure including the conductive layer.

11. The nonvolatile semiconductor memory device according to claim 9, wherein the floating gate includes the conductive layer.

12. A nonvolatile semiconductor memory device in which a plurality of memory cells are arranged in an array-like configuration to constitute a cell array having a plurality of device isolation regions buried by an insulation material in trenches formed in a semiconductor substrate, a plurality of device forming regions each of which is divided with the device isolation regions, and in which each of the memory cells has a floating gate including a conductive layer which is formed on a first gate insulation film in the device forming region, the conductive layer has side walls arranged in alignment with the device forming regions and a control gate is formed on the floating gate via a second gate insulation film, and the nonvolatile semiconductor memory device has at least one peripheral transistor having a gate electrode formed on the semiconductor substrate via a third gate insulation film thicker than the first gate insulation film, wherein:

the conductive layer has a width between the side walls at a lower end of the conductive layer facing the device isolation regions wider than a width at an upper end of the conductive layer, at least one of the side walls of the conductive layer is formed in a tapered configuration, the taper angle formed between the side wall of the conductive layer and the bottom surface is 80 degrees or more and less than 90 degrees, and the trench in the device isolation region formed in the memory array has a depth deeper than a trench of the device isolation region formed in the peripheral transistor.

13. A nonvolatile semiconductor memory device in which a plurality of memory cells are arranged in an array-like configuration to constitute a cell array having a plurality of device isolation regions buried by an insulation material in trenches formed in a semiconductor substrate, and a plurality of device forming regions each of which is divided with the device isolation regions, and in which each of the memory cells includes a floating gate formed via a first gate insulation film on the device forming region which is in alignment with the floating gate, and a control gate formed on the floating gate via a second gate insulation film, wherein at least a portion of the floating gate sandwiched with the device isolation regions has a lower end contacting with a surface of the semiconductor substrate via the first gate insulation film with a width larger than that of an upper end of the sandwiched portion, and the device isolation regions each have a width of 0.25 $\mu$m or less.

* * * * *